United States Patent
Chang et al.

(10) Patent No.: US 7,282,122 B2
(45) Date of Patent: Oct. 16, 2007

(54) METHOD AND SYSTEM FOR TARGET LIFETIME

(75) Inventors: Hui Wen Chang, Tucheng (TW); Chang Hui Chao, Hsinchu (TW); Hong Yi Wu, Hsinchu (TW)

(73) Assignee: Taiwan Semiconductor Manufacturing Company (TW)

( * ) Notice: Subject to any disclaimer, the term of this patent is extended or adjusted under 35 U.S.C. 154(b) by 686 days.

(21) Appl. No.: 10/810,534

(22) Filed: Mar. 26, 2004

(65) Prior Publication Data

US 2005/0211549 A1     Sep. 29, 2005

(51) Int. Cl.
C23C 14/32    (2006.01)
C23C 14/00    (2006.01)
C25B 9/00     (2006.01)
C25B 11/00    (2006.01)
C25B 13/00    (2006.01)

(52) U.S. Cl. ............................ 204/192.13; 204/298.12
(58) Field of Classification Search ............ 204/192, 204/192.13, 298.03
See application file for complete search history.

(56) References Cited

U.S. PATENT DOCUMENTS

| | | | | |
|---|---|---|---|---|
| 4,166,783 A | * | 9/1979 | Turner | 204/192.13 |
| 4,983,269 A | * | 1/1991 | Wegmann | 204/192.13 |
| 5,478,455 A | * | 12/1995 | Actor et al. | 204/192.13 |
| 5,487,823 A | * | 1/1996 | Sawada et al. | 204/298.12 |
| 6,340,415 B1 | | 1/2002 | Raaijmakers | |
| 6,416,635 B1 | * | 7/2002 | Hurwitt et al. | 204/192.13 |
| 6,497,797 B1 | | 12/2002 | Kim | |
| 6,610,181 B1 | * | 8/2003 | Besser et al. | 204/192.13 |
| 2004/0020769 A1 | * | 2/2004 | Ivannov et al. | 204/298.12 |
| 2005/0236266 A1 | * | 10/2005 | Poole et al. | 204/192.13 |

* cited by examiner

Primary Examiner—Alexa D. Neckel
Assistant Examiner—Michael Band
(74) Attorney, Agent, or Firm—Duane Morris, LLP

(57) ABSTRACT

A method and system for determining a lifetime of a target for a physical vapor deposition tool (302), has, a mapping table (304a) of criteria for a minimum accumulating rate of Δ wafers fabricated by Δ target life for a target in the tool; and a database (304) recording Δ wafers fabricated by Δ target life for a target in the tool; and a computer (306) retrieving the criteria from the mapping table and entering the criteria in the database; and the tool (302) reporting Δ wafers fabricated by Δ target life for a target in the tool (302) for comparison with the criteria.

12 Claims, 4 Drawing Sheets

METHOD AND SYSTEM FOR TARGET LIFETIME

FIELD OF THE INVENTION

The invention pertains to methods and systems for determining lifetimes of targets in metal deposition processes for physical vapor deposition.

BACKGROUND

A target is a physical vapor deposition (PVD) source that is deposited in a PVD tool. The target is depleted by plasma bombardment to sputter coat semiconductor wafers. A target needs to be replaced near the end of its actual target lifetime.

FIG. 1 discloses a graph (100) of an actual target lifetime in KWH of a target being used and depleted in a PVD tool versus the accumulating hours of deposit time, (T). The actual target lifetime is expressed in kilowatt hours (KWH), and depends upon the power rate of the PVD tool and the hours of deposit time for the target in the tool. When the actual target lifetime of graph (100) attains the estimated target lifetime of value (B) in KWH, the target has been depleted to the extent that the target must be replaced after accumulating the hours of deposit time, value (D).

The PVD tool is controlled by a computer to operate a database that records the hours of deposit time (T) for the target in the tool. The KWH power rate of the tool is known, and is recorded in the database. FIG. 1 discloses a reported graph (102) generated by the database. The reported graph (102) reports estimated changes in the estimated target lifetime (KWH) of the target for the accumulating hours of deposit time (T) in the tool. However, the actual hours of accumulating deposit time for the target in the tool can exceed the hours recorded in the database. Such an error occurs when some of the hours of deposit time are unrecorded. Further, such an error occurs due to unexpected equipment system conditions that make the hours of deposit time (T), as reported by the tool, to appear less than the actual hours of deposit time. Thus, the reported graph (102) in FIG. 1 discloses that the reported estimated lifetime change, as reported by the tool, is less than the actual lifetime change of the target (104).

The reported target lifetime remains below the value (B) during the time period from the time (D) to a time (E). The time (E) is past the time (D) corresponding to the actual target lifetime, value (B). Thus, the reported target lifetime, as reported by the tool, will not indicate a trend toward a target overrun that occurs from the time (D) to the time (E). During a target overrun, wafer scraps are produced by the tool. The tool cannot indicate whether a target overrun would be the source of such wafer scraps. Thus, time must be spent to search for the cause of such wafer scraps.

The data reported by the tool would not accurately indicate a trend for when the target in the tool exceeds its actual target lifetime (B). Continuing to operate the tool with a target that has exceeded its target lifetime (B) is a condition referred to as a target overrun, resulting in fabrication of wafer scraps.

For the above reasons, there is a need for the tool to record an estimated target lifetime in a manner that will detect a trend toward target overrun.

SUMMARY OF THE INVENTION

The invention provides a method and a system for detecting a trend toward target overrun, which is different than the prior art method and system for reporting an estimated target lifetime. The new method and system is able to use a PVD tool and data recorded in a database that has generated the graph of FIG. 1 for detecting a trend toward target overrun. The invention sets an ideal slope, $\Delta$ Target lifetime/$\Delta$ wafers fabricated per unit of KWH, under ideal equipment system conditions. The slope of the graph reported by the PVD tool, i.e., the reported graph, is compared with the ideal slope according to the invention. When the slope of the reported graph becomes less than the ideal slope, the graph reported by the tool indicates a trend toward target overrun. An operator is alerted by the reported graph to examine the target in the tool and decide whether the target needs to be replaced. According to an embodiment of the invention, the tool is modified with an alarm device activated by the tool computer when the data reported by the tool indicates a trend toward target overrun.

DETAILED DESCRIPTION

Figure 1:
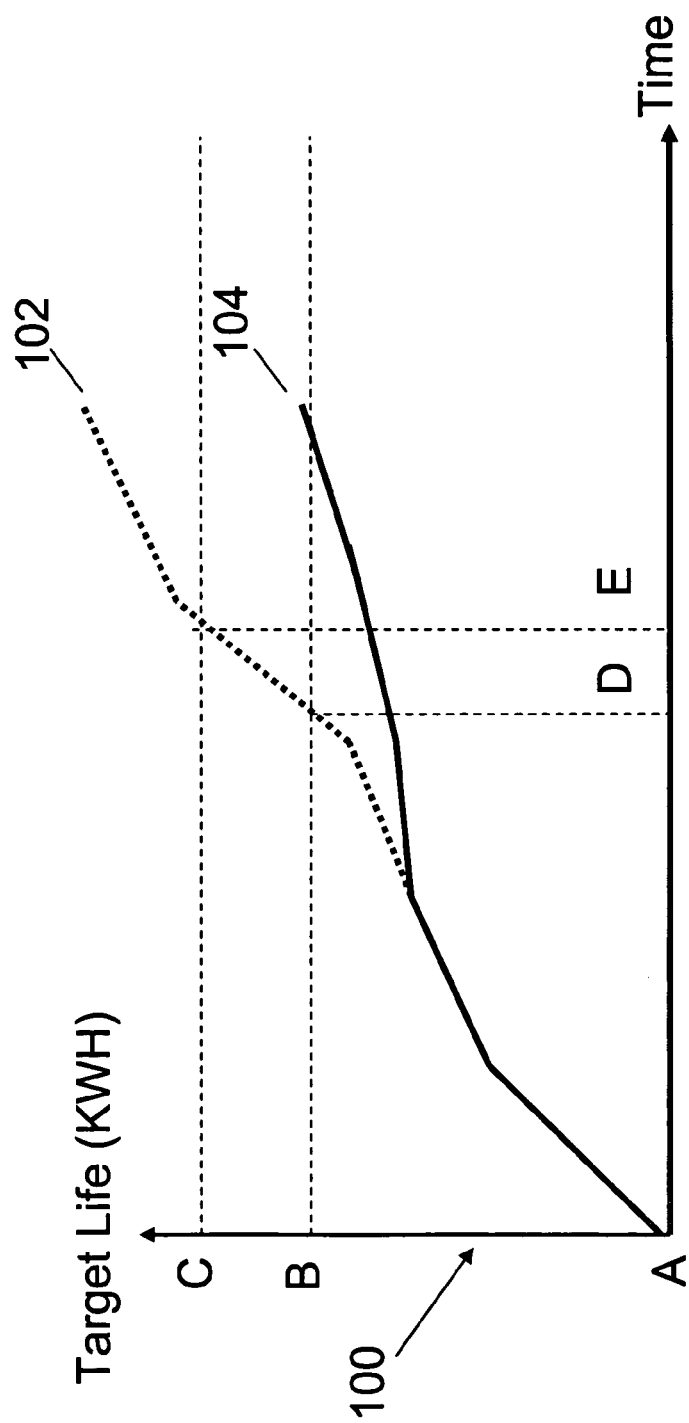
FIG. 1 is a reported graph of reported target lifetime compared to a graph of actual target lifetime.

The invention provides a method and system for detecting a trend toward target overrun. The invention is able to rely on the number of wafers fabricated as being a constant number corresponding to the actual lifetime, as measured in total KWH, for a certain target in a certain tool. Further, the invention is able to rely on the total number of wafers fabricated as being a constant number for the total hours of deposit time corresponding to the actual lifetime of the certain target in the certain tool. Thus, the invention interprets the graph of FIG. 1 to indicate the change in target lifetime over the number of wafers fabricated per unit of total hours of deposit time of the target in the tool.

A method according to the invention selects a value, $\Delta$ Target lifetime/$\Delta$ wafers fabricated, as the accumulating rate (AR). The thinnest wafers fabricated by the PVD tool are the largest $\Delta$ wafers fabricated during a $\Delta$ Target lifetime. Thus, the method according to the invention selects a minimum accumulating rate (MAR), $\Delta$ Target lifetime/$\Delta$ thinnest wafers fabricated.

The invention interprets the time (T), abscissa of the graph (102), to further represent, $\Delta$ wafers fabricated per unit of time. Thus, FIG. 2 is a graph (200) generated from the database of the PVD tool that reports a reported accumulating rate (RAR), $\Delta$ Target lifetime/$\Delta$ wafers fabricated per unit of time.

The invention is able to rely on a linear relationship, that would exist under ideal equipment system conditions, between the number of wafers fabricated and the actual target lifetime of a certain target in a certain PVD tool. Further, a linear relationship would exist between the number of wafers run and (1) one KWH generated by the PVD tool. According to an embodiment of the invention, an ideal slope of the (MAR) is set to the value, 1 (KWH)/the number of wafers fabricated for (1) one KWH, and is referred to as the exhausting slope for the minimum accumulating rate (MAR). For a certain target in a certain PVD tool, the exhausting slope would be a constant under ideal equipment system conditions.

Figure 2:
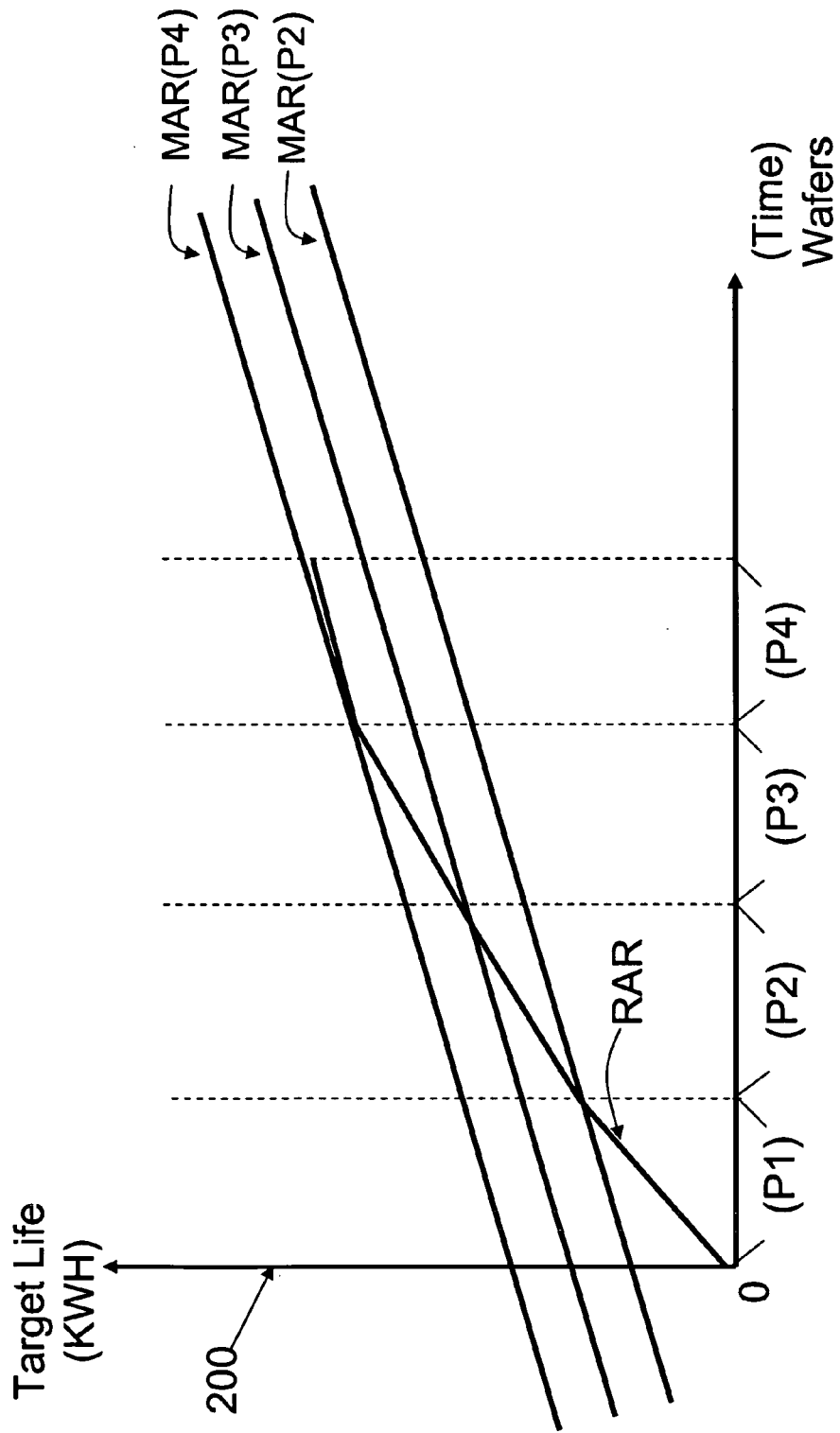
FIG. 2 is a graph of reported target lifetime compared to an ideal slope of an ideal graph of $\Delta$ Target lifetime/$\Delta$ wafers fabricated per unit of KWH, under ideal equipment system conditions.

FIG. 2 discloses a reported graph (200) that discloses the exhausting slope (MAR2), (MAR3) and (MAR4) compared with a graph of the reported accumulating rate (RAR), i.e., the graph of Δ Target lifetime/Δ wafers fabricated unit of time, for the successive time periods (P1), (P2), (P3) and (P4), which are time periods dividing the recorded hours of deposit time for the target.

During the time periods (P2) and (P3), the graph of reported accumulating rate (RAR) has a slope that is not less than the slope of the minimum accumulating rate (MAR), which corresponds to (RAR)>(MAR), which indicates that the PVD tool operation is normal, and the target is not ready to be replaced.

FIG. 2 discloses, for the time period (P4), the slope for the reported accumulating rate (RAR) becomes less than the exhausting slope for the minimum accumulating rate (MAR). For example, if (MAR)=1/100, and if (RAR)=1/150, then the slope for (RAR) becomes less than the exhausting slope for (MAR), which indicates (RAR)<(MAR), and a trend toward target overrun.

According to an embodiment of the invention, the invention sets a constant ideal slope, Δ Target lifetime/Δ wafers fabricated, under ideal equipment system conditions. The invention compares the ideal slope to the slope of the graph reported by the PVD tool, such as, the reported graph (200) of FIG. 2. When the slope of the reported graph (102) becomes less than the ideal slope, the graph (102) reported by the tool indicates a trend toward target overrun. An operator is alerted by the reported graph (102) to examine the target in the tool and decide whether the target needs to be replaced.

According to a further embodiment of the invention, the tool is modified with an alarm activated by the tool computer, when the data reported by the tool indicates a trend toward target overrun. The PVD tool is modified with an alarm device to generate an alarm signal when (RAR)< (MAR). With reference to FIG. 2, the alarm signal indicates detection of a possibility for target overrun operation during the time period (P4). In response to the alarm signal, an operator of the PVD tool then examines the target and decides whether to replace the target.

Figure 3:
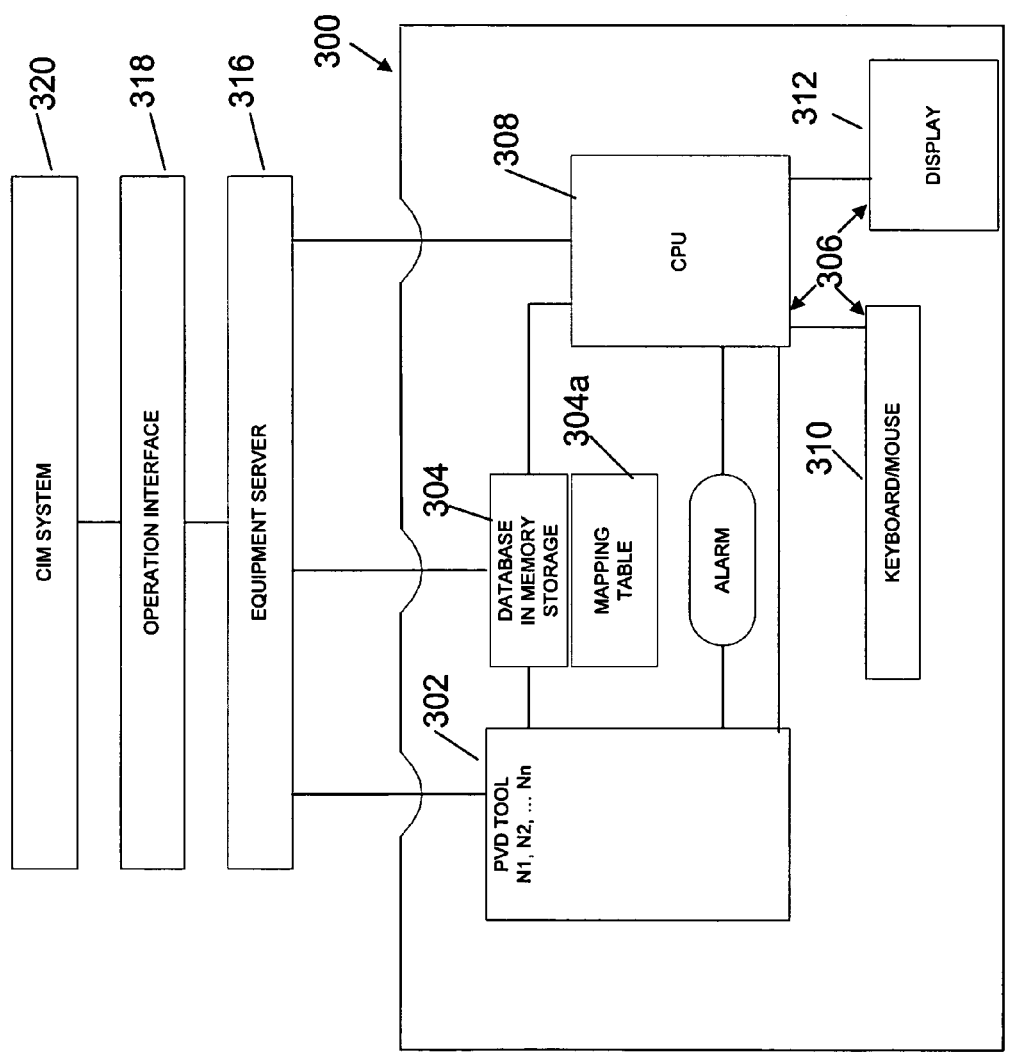
FIG. 3 is a circuit diagram of a system for determining a trend toward target overrun.

FIG. 3 discloses a system (300) for determining a trend toward target overrun. The system (300) includes a PVD tool (302) representing one of a series of PVD tools N1, N2, . . . Nn. Each PVD tool (302) has a database (304) stored in a memory storage device and a computer (306), which are interconnected for exchanging digital communications among one another. The computer (306) has a central processing unit (308) and a keyboard and mouse, command input device (310) and a computer video display (312). An alarm (314) is provided by the tool (302), and is activated by the computer (306) when the data reported by the tool indicates a trend toward target overrun. The system (300) is connected to an equipment server (316). In a distributed architecture, the tool (302), the memory storage device having the database (304) and the computer (308) are connected by distributed connections to the server (316). In turn, the server (316) is connected to an operation interface (318), in turn, connected to a central integrated manufacturing system, CIM system (320).

In the system (300), the number of wafers fabricated by the tool (302) and the fabrication times are reported in the database (304), either by an operator using the computer (306), or, alternatively, by the PVD tool (302) being equipped with known counting mechanisms. The tool (302) records in the database (304) the hours of deposit time of the target in the tool (302), and the actual target lifetime in KWH. Thus, the database (304) is capable of generating the graph (102) disclosed by FIG. 1. Further, the database (304) is capable of displaying the graph on the computer display (312).

Figure 4:
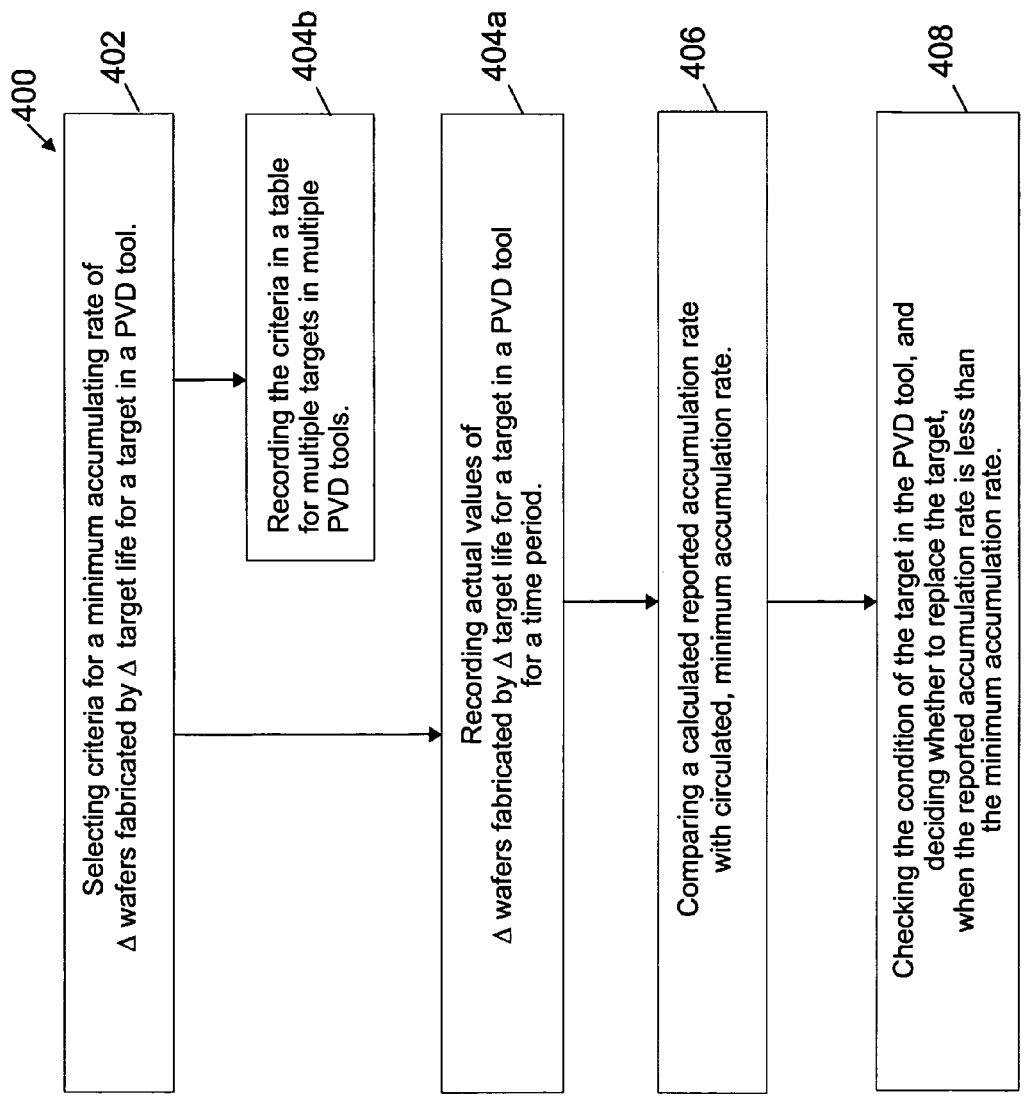
FIG. 4 is a flow chart of a method for determining a trend toward target overrun.

FIG. 4 discloses a process chart of a method (400) for determining a trend toward target overrun. An accumulating rate (AR) is in the form of a minimum accumulating rate (MAR) when it is calculated based on the accumulating rate criteria. FIG. 4 discloses, at (402) a method step of selecting criteria for a minimum accumulation rate of Δ wafers fabricated by Δ target life for a target in a PVD tool. (302). The minimum accumulating rate criteria, include, but is not limited to, the number of thinnest wafers fabricated during the estimated target lifetime of a certain target in a certain PVD tool (302), as measured by the total KWH output of the tool corresponding to the actual lifetime of the target in the tool. FIG. 4 further discloses, at (404a) a method step of recording actual values of Δ wafers fabricated by Δ target life for a target in a PVD tool. (302)for a time period. For example, in FIG. 2, each of the deposit time periods (P1), (P2), (P3) and (P4) can accumulate over a time period of once each calendar day, or once each manufacturing shift.

FIG. 4 discloses an alternative method step (404b) of recording the minimum accumulating rate criteria in a table for multiple targets in multiple PVD tools. According to the alternative method step (404b), a mapping table (304a) is created that maps the minimum accumulating rate criterion for multiple targets in respective PVD tools N1, N2, . . . Nn. (302) and for all of the KWH servo power of the certain PVD tools (302). The mapping table (304a) can be kept in a computer memory storage, separately, or added to the database (304).

The computer (306) retrieves the correct criterion for the certain tool (302) and the certain target from the mapping table (304a) and enters it in the database (304). A database calculation calculates the (MAR) from the data recorded in the mapping table (304a). The database (304) accesses the mapping table (304a) in computer memory storage, or the mapping table (304a) is added to the database (304).

The Δ target life and Δ wafers for each deposit time period is recorded in the database (304). A reported accumulating rate (RAR) is calculated for each deposit time period. For example, the RAR is calculated by the database, or, alternatively, by an operator of the computer ((306).

FIG. 4 discloses a process step (406) of comparing a calculated reported accumulation rate with a calculated minimum accumulation rate. Thereby, the (RAR) is compared with the (MAR). For the first time period that the (RAR) becomes less than the (MAR), an operator is alerted by the graph, for example, by the graph (200) generated by the database (304) of the tool (302). In the graph (200) the (RAR) first becomes less than the (MAR) for the time period (R4). Alternatively, the tool is modified with the alarm device (314) that is activated by a signal from the computer (306) that is signaled by the database (304) when the database (304) executes a database calculation of the (RAR) from the data entered in the database (304), and calculates it to be less than the (MAR). Then, the operator will perform the method step (408) of checking the condition of the target in the PVD tool, and deciding whether to replace the target, when the accumulation rate is less than the minimum accumulation rate.

Thus, the method and system of the invention checks whether the accumulating rate (RAR) violates the criteria for the (MAR) for each time period. For the first time period that the (RAR) becomes less than the (MAR), an operator is alerted to check the target in the PVD tool (302) and decides whether to replace the target.

The invention prevents target overruns to produce good quality coated wafers. The invention avoids wafer scraps, and avoids the time to search for the cause of wafer scraps.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for determining a target lifetime for a physical vapor deposition tool, comprising the steps of:
    selecting criteria for a minimum accumulating rate of a number of wafers fabricated per unit of deposit time by a change in target life for a target in the tool;
    recording actual values of the number of wafers fabricated per unit of deposit time by the change in target life for a target in the tool; for a time period;
    comparing a calculated reported accumulating rate with a calculated minimum accumulating rate, and
    deciding whether to replace the target when the reported accumulating rate is less than the minimum accumulating rate.

2. The method of claim 1, further comprising the steps of:
    recording the criteria in a table for multiple targets in respective multiple ones of the tool; and
    selecting the criteria by retrieving the criteria from the table.

3. The method of claim 1, and further comprising the step of generating an alarm when the reported accumulating rate is less than the minimum accumulating rate.

4. The method of claim 1, wherein the step of selecting criteria for a minimum accumulating rate, further comprises selecting the criteria of thinnest wafers fabricated by the tool for a minimum accumulating rate of the number of thinnest wafers fabricated per unit of deposit time by the change in target life for a target in the tool.

5. The method of claim 4, further comprising the step of recording the criteria in a table for multiple targets in respective multiple ones of the tool.

6. The method of claim 4, further comprising the step of generating an alarm when the reported accumulating rate is less than the minimum accumulating rate.

7. The method of claim 1, wherein the step of comparing a calculated reported accumulating rate with a calculated minimum accumulating rate further comprises the step of comparing a graph of the reported accumulating rate with a slope of the minimum accumulating rate for one KWH of tool power.

8. The method of claim 7, further comprising the step of: generating an alarm when the graph has a slope that is less than the slope of the minimum accumulating rate for one KWH of tool power.

9. The method of claim 7, further comprising the step of: recording the criteria in a table for multiple targets in respective multiple ones of the tool.

10. The method of claim 7, further comprising the step of: generating an alarm when the reported accumulating rate is less than the minimum accumulating rate.

11. The method of claim 7, wherein the step of selecting criteria for a minimum accumulating rate; further comprises the step of selecting the criteria of thinnest wafers fabricated by the tool for a minimum accumulating rate of the number of thinnest wafers fabricated per unit of deposit time by the change in target life for a target in the tool.

12. A system for determining a lifetime of a target for a physical vapor deposition tool, comprising:
    a mapping table of criteria for a minimum accumulating rate of a number of wafers fabricated per unit of deposit time by the change in target life for a target in the tool;
    a database recording the number of wafers fabricated per unit of deposit time by the change in target life for a target in the tool; and
    a computer retrieving the criteria from the mapping table and entering the criteria in the database;
    wherein the tool is configured to (a) compare a calculated reported accumulating rate with the minimum accumulating rate; (b) report the number of wafers fabricated per unit of deposit time by the change in target life for a target in the tool for comparison with the criteria; and (c) deciding whether to replace the target when the reported accumulating rate is less than the minimum accumulating rate.

* * * * *

UNITED STATES PATENT AND TRADEMARK OFFICE
CERTIFICATE OF CORRECTION

| | | |
|---|---|---|
| PATENT NO. | : 7,282,122 B2 | Page 1 of 1 |
| APPLICATION NO. | : 10/810534 | |
| DATED | : October 16, 2007 | |
| INVENTOR(S) | : Hui Wen Chang, Chang Hui Chao and Hong Yi Wu | |

It is certified that error appears in the above-identified patent and that said Letters Patent is hereby corrected as shown below:

Column 5, line 35, delete "and".

Column 6, line 21, delete "rate;" and insert -- rate -- therefor.

Signed and Sealed this

First Day of April, 2008

JON W. DUDAS
*Director of the United States Patent and Trademark Office*